United States Patent
Lin (10) Patent No.: US 9,390,807 B2
(45) Date of Patent: Jul. 12, 2016

(54) ERASE METHOD FOR FLASH

(71) Applicant: Winbond Electronics Corp., Taichung (TW)

(72) Inventor: Hung-Hsueh Lin, Hsinchu (TW)

(73) Assignee: WINBOND ELECTRONICS CORP., Taichung (TW)

(*) Notice: Subject to any disclaimer, the term of this patent is extended or adjusted under 35 U.S.C. 154(b) by 23 days.

(21) Appl. No.: 14/164,383

(22) Filed: Jan. 27, 2014

(65) Prior Publication Data

US 2015/0213897 A1    Jul. 30, 2015

(51) Int. Cl.
 *G11C 16/16* (2006.01)
 *G11C 16/34* (2006.01)
 *G11C 16/10* (2006.01)

(52) U.S. Cl.
 CPC .......... *G11C 16/3445* (2013.01); *G11C 16/107* (2013.01); *G11C 16/16* (2013.01); *G11C 16/3409* (2013.01)

(58) Field of Classification Search
 CPC .............................. G11C 16/16; G11C 16/344
 USPC ..................................................... 365/185.29
 See application file for complete search history.

(56) References Cited

U.S. PATENT DOCUMENTS

| | | | | |
|---|---|---|---|---|
| 5,699,298 A * | 12/1997 | Shiau et al. | ............... | 365/185.18 |
| 5,745,410 A * | 4/1998 | Yiu et al. | ................... | 365/185.3 |
| 6,222,779 B1* | 4/2001 | Saito et al. | ............... | 365/189.09 |
| 6,498,752 B1* | 12/2002 | Hsu et al. | ................. | 365/185.22 |
| 2009/0067257 A1* | 3/2009 | Lee | .................... | G11C 16/0483 365/185.33 |
| 2010/0246265 A1* | 9/2010 | Moschiano | ........ | G11C 11/5635 365/185.11 |

* cited by examiner

*Primary Examiner* — Hoai V Ho
*Assistant Examiner* — Jay Radke
(74) *Attorney, Agent, or Firm* — Muncy, Geissler, Olds & Lowe, P.C.

(57) ABSTRACT

An erase method for a flash memory is provided. First memory cells of the flash memory are pre-programmed. The first memory cells are disposed in a memory array formed by a plurality of row and column lines. The programmed first memory cells are erased. The erased first memory cells are post-programmed, to repair the over-erased first memory cells. Second memory cells are programmed after the erased first memory cells are post-programmed. The second memory cells are disposed in a first specific column line of the memory array. The first specific column line is arranged after a last column line corresponding to a last valid column address. Third memory cells disposed in a second specific column line of the memory array. The second specific column line is arranged after the last column line and is adjacent to the first specific column line.

12 Claims, 12 Drawing Sheets

ERASE METHOD FOR FLASH

BACKGROUND OF THE INVENTION

1. Field of the Invention

The invention relates to an erase method of a flash memory, and more particularly to an erase method of a flash memory for quickly determining a blank sector.

2. Description of the Related Art

Specific data is written into a flash memory by a program mechanism and an erase mechanism for data storage. In general, the write algorithm and the erase algorithm will induce different issues according to various command sheets, e.g. over erase. Taking an erase procedure as an example, the erase procedure mainly comprises a pre-program step, an erase step and a post-program step, to ensure that each memory cell is at a logic level "1" after the erase procedure is performed. When the erase procedure and the program procedure is repeatedly performed, the execution time of the erase procedure will gradually increase with the increase in the number of writing times, wherein the post-program step of repairing the over-erased memory cells will occupy most of the execution time in the erase procedure. When a sudden event occurs, such as when a shutdown condition suddenly occurs, the post-program may be interrupted, which causes the post-program step of the flash memory to not be performed completely. Thus, it needs more time to verify the flash memory, and to find a blank sector, so as to avoid any over-erased memory cell in the sector that will cause false readings.

BRIEF SUMMARY OF THE INVENTION

An embodiment of an erase method for a flash memory is provided. A plurality of first memory cells of the flash memory are pre-programmed, wherein the first memory cells are disposed in a memory array formed by a plurality of row lines and a plurality of column lines. The programmed first memory cells are erased. The erased first memory cells are post-programmed, to repair the over-erased first memory cells. A plurality of second memory cells are programmed after the erased first memory cells are post-programmed, wherein the second memory cells are disposed in a first specific column line of the memory array, and the first specific column line is arranged after a last column line corresponding to a last valid column address. The memory array further comprises a plurality of third memory cells disposed in a second specific column line of the memory array, wherein the second specific column line is arranged after the last column line and is adjacent to the first specific column line.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
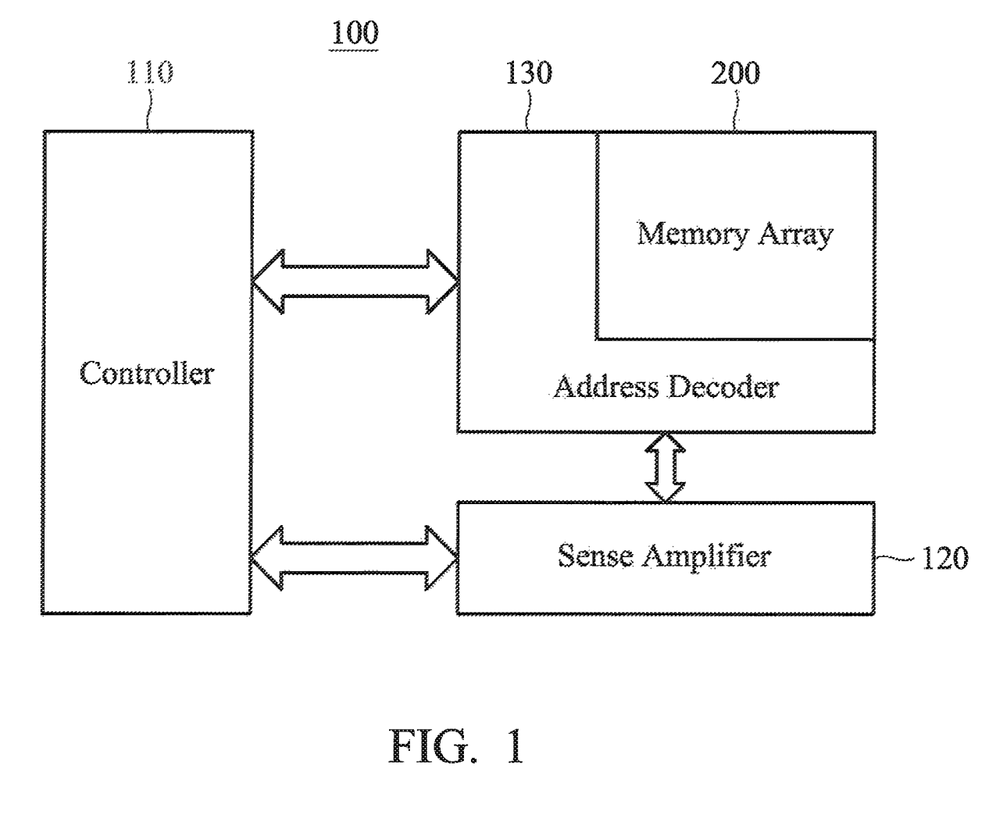
FIG. 1 shows a flash memory according to an embodiment of the invention.
Figure 2:
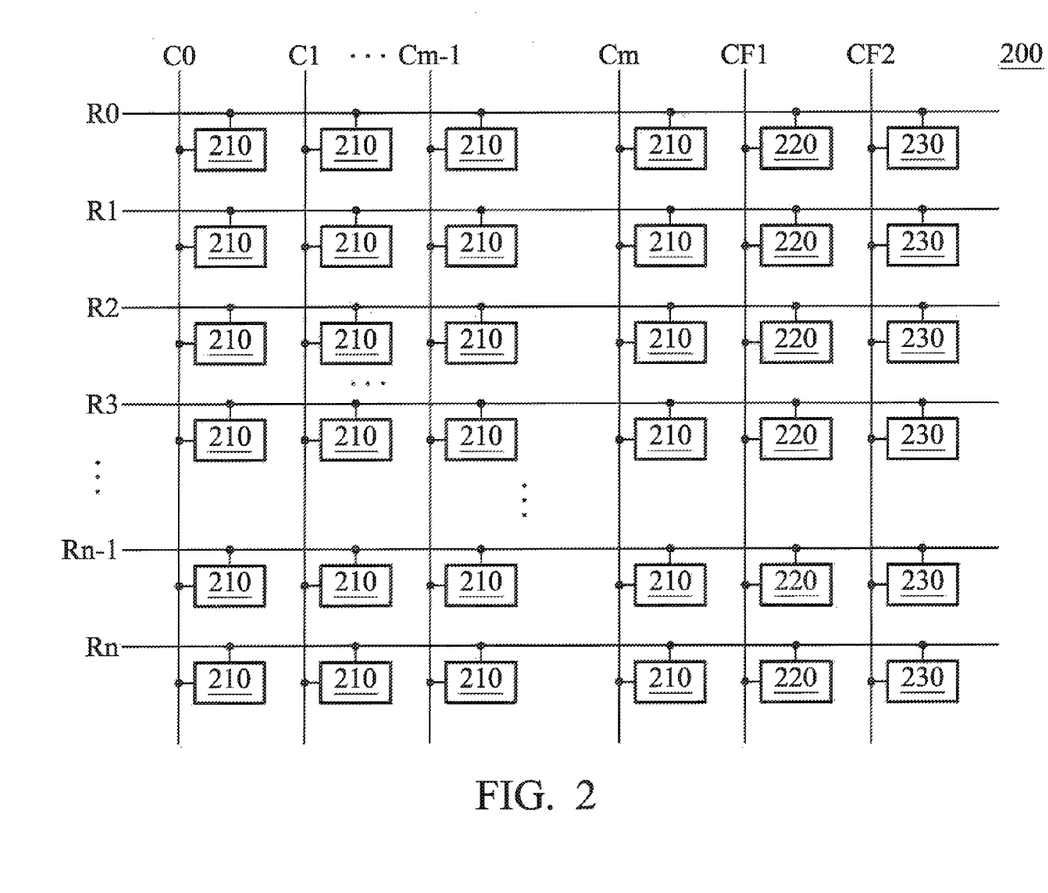
FIG. 2 shows a schematic illustrating the memory array of FIG. 1.

FIG. 1 shows a flash memory 100 according to an embodiment of the invention. The flash memory 100 comprises a controller 110, a sense amplifier 120, an address decoder 130 and a memory array 200. FIG. 2 shows a schematic illustrating the memory array 200 of FIG. 1. The memory array 200 comprises a plurality of memory cells 210, 220 and 230, wherein the memory cells 210, 220 and 230 are disposed in an array formed by a plurality of row lines R0-Rn and a plurality of column lines C0-Cm, CF1 and CF2. In the embodiment, the row lines R0-Rn are word lines, and the column lines C0-Cm, CF1 and CF2 are bit lines. Furthermore, in the memory array 200, each of the row lines R0-Rn respectively represents a valid row address, and each of the column lines C0-Cm respectively represents a valid column address. In other words, through the row lines R0-Rn and the column lines C0-Cm, a controller (e.g. the controller 110 of FIG. 1) can access the memory cells 210 via the address decoder 130, so as to provide the data stored in the memory cells 210 to the other devices or to update the data stored in the memory cells 210. Compared with a traditional memory array, the column lines CF1 and CF2 of the memory array 200 are the additional bit lines or the additional column lines. The memory cells 220 coupled to the column line CF1 and the memory cells 230 coupled to the column lines CF2 are the flag memory cells, wherein the flag memory cells are used to indicate the states of memory cells 210 of the corresponding row lines. For example, the memory cells 220 and 230 disposed in the row line R0 are used to indicate the states of the memory cells 210 disposed in the row line R0, and the memory cells 220 and 230 disposed in the row line Rn are used to indicate the states of the memory cells 210 disposed in the row line Rn. Thus, according to the logic levels of the memory cells 220 and 230 of each sector, the controller can determine whether the sector has been completely erased, the valid data are stored in the sector, and so on. It should be noted that the locations of the memory cells 220 and 230 are used as an example and not meant to limit the invention. In one embodiment, the memory cells 230 are disposed in the column line F1, and the memory cells 220 are disposed in the column line F2.

Figure 3:
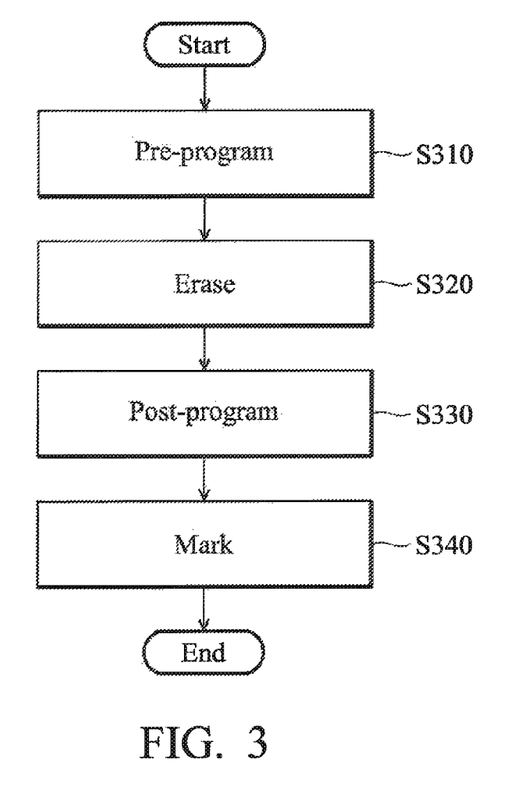
FIG. 3 shows an erase method for the flash memory of FIG. 1 according to an embodiment of the invention.

FIG. 3 shows an erase method for the flash memory of FIG. 1 according to an embodiment of the invention. Referring to FIG. 1 and FIG. 3 together, first, in step S310, the controller 110 performs a pre-program procedure on the memory array 200, so as to program all memory cells of the memory array 200 to a logic level "0". Next, in step S320, the controller 110 performs an erase procedure on the memory array 200, so as to erase all memory cells of the memory array 200 to a logic level "1". Next, in step S330, the controller 110 performs a post-program procedure on the memory array 200, so as to repair the over-erased memory cells. Next, in step S340, the controller 110 performs a mark procedure on the specific memory cells (e.g. the memory cells 220 or 230 of FIG. 2) of the memory array 200, to record a result of the erase procedure. Details of the pre-program procedure, the erase procedure, the post-program procedure and the mark procedure will be described below.

Figure 4A:
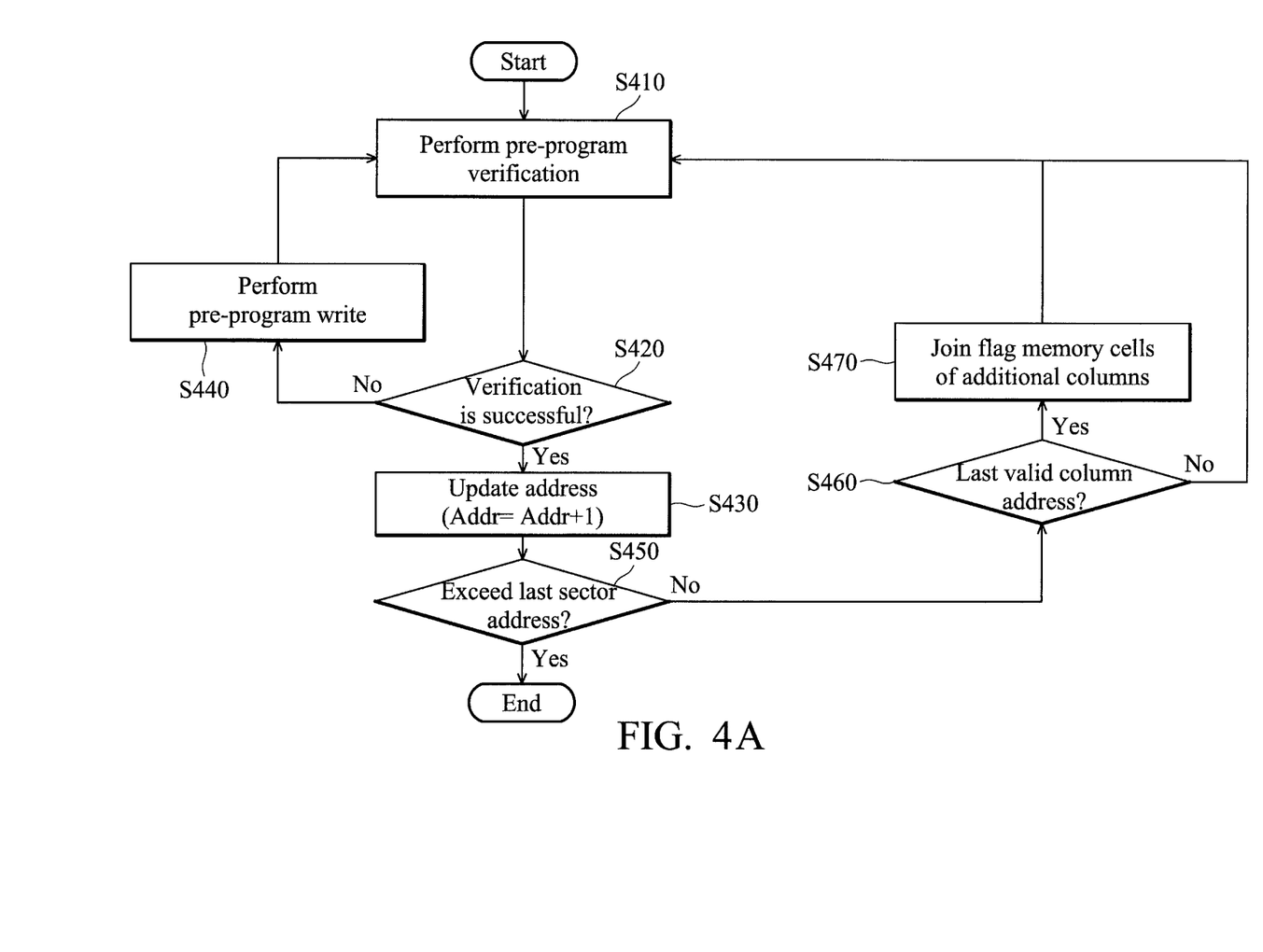
FIG. 4A shows a flow chart of a pre-program procedure of a flash memory according to an embodiment of the invention.

FIG. 4A shows a flow chart of a pre-program procedure of a flash memory according to an embodiment of the invention. The purpose of performing the pre-program procedure is that each memory cell of the memory array 200 can have a similar voltage level before an erase procedure is performed, so as to avoid the need to repeatedly perform the erase procedure for decreasing the generation of over-erased memory cells. Referring to FIG. 2 and FIG. 4A together, in the embodiment, a sense amplifier (e.g. the sense amplifier 120 of FIG. 1) of the flash memory uses the additional read/write units to perform the read and write operations for the additional memory cells 220 and 230. First, in step S410, according to an address Addr (e.g. Addr=0, i.e. an initial address), the controller performs a pre-program verification for the memory cells 210 of the bytes or words corresponding to the address Addr. Next, in step S420, the controller determines whether the pre-program verification is successful, i.e. it is determined whether each memory cell 210 corresponding to the address Addr is at a logic level "0". If the pre-program verification is unsuccessful (e.g. at least one memory cell 210 corresponding to the address Addr is at a logic level "1"), the controller performs a pre-program write operation, so as to program all memory cells 210 corresponding to the address Addr to a logic level "0" (step S440). Next, the procedure goes back to step S410, and the controller performs the pre-program verification for the memory cells 210 corresponding to the address Addr again (step S410) until the controller determines that the pre-program verification is successful (step S420). Next, in step S430, the controller increases the address Addr by one (e.g. Addr=Addr+1, i.e. to point to the next address), so as to update the address Addr. For example, if Addr=(Rn−1,Cm−1), the controller increases the address Addr=(Rn−1,Cm−1) by one, so as to obtain new address Addr=(Rn−1,Cm). Next, in step 450, the controller determines whether the address Addr is larger than a last sector address Addr_last_Sector. In the embodiment, the last sector address Addr_last_Sector is a last address (e.g. (Rn, Cm)) of the sector formed by the memory cells 210. If the address Addr exceeds the last sector address Addr_last_Sector, the pre-program procedure is completed. Conversely, if the address Addr is smaller than or equal to the sector address Addr_last_Sector, the controller determines whether the updated address Addr is a last valid column address Cm (step S460). If the updated address Addr is not the valid column address Cm, the procedure goes back to step S410. Thus, the controller performs the pre-program verification for the memory cells 210 corresponding to the updated address Addr again, and then the subsequent processes are performed. If the updated address Addr is the valid column address Cm (i.e. Addr=Cm), the controller joins the additional bit lines CF1 and CF2 into the pre-program verification (step S470), so as to verify the memory cells of the address Addr and the memory cells of the additional columns CF1 and CF2 corresponding to the same row address. Thus, in step S410, the controller performs the pre-program verification for the memory cells 210 corresponding to the last valid column address Cm, the memory cell 220 of the additional column CF1 corresponding to the same row address and the memory cell 230 of the additional column CF2 corresponding to the same row address. As described above, if the pre-program verification is unsuccessful, the pre-program write operation is performed, so as to program the memory cells 210 corresponding to the address Addr, the memory cell 220 of the additional column CF1 corresponding to the address Addr, and the memory cell 230 of the additional column CF2 corresponding to the address Addr to a logic level "0" (step S440), and then the subsequent processes are performed.

Figure 4B:
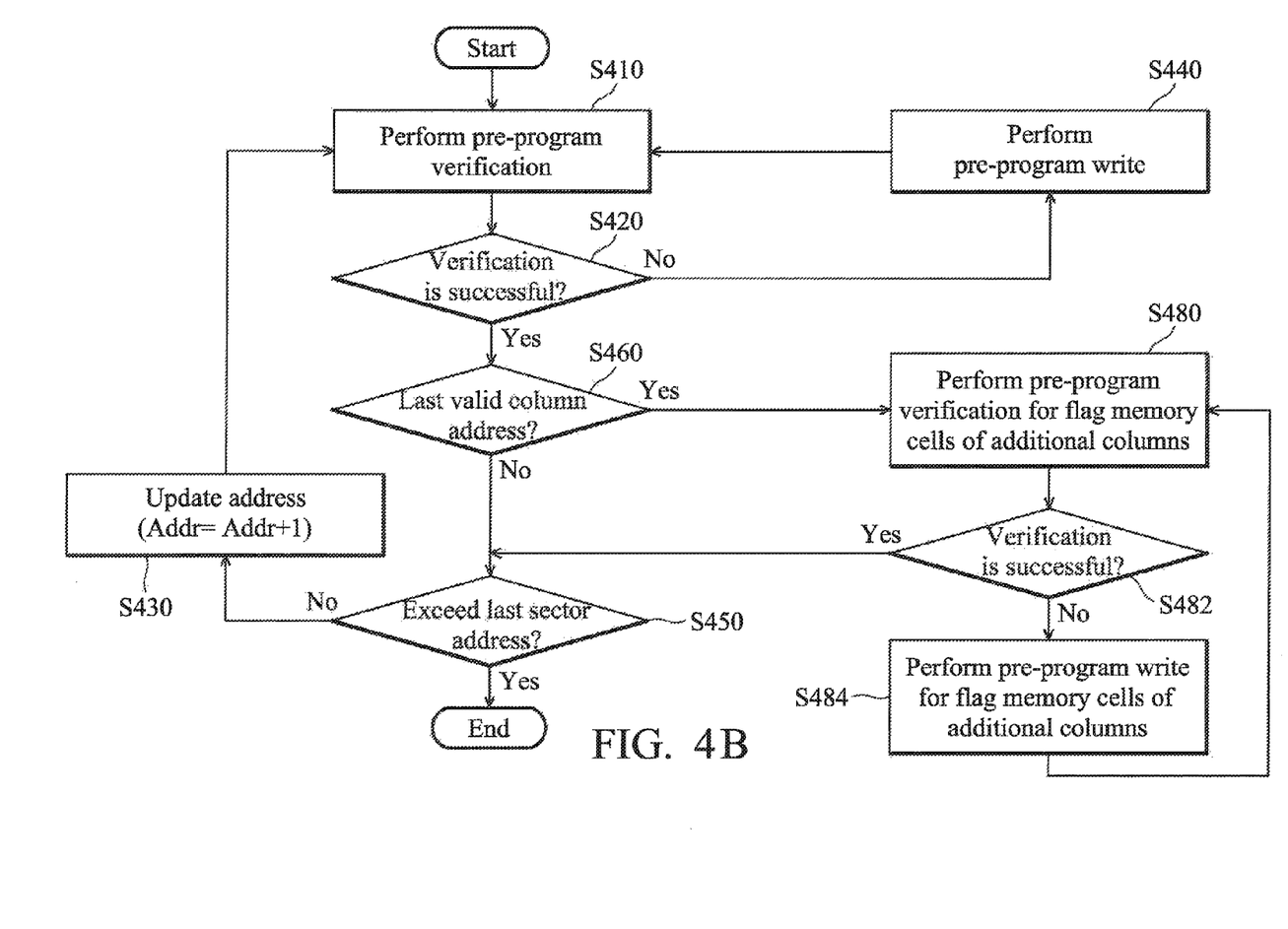
FIG. 4B shows a flow chart of a pre-program procedure of a flash memory according to another embodiment of the invention.

FIG. 4B shows a flow chart of a pre-program procedure of a flash memory according to another embodiment of the invention. Referring to FIG. 2 and FIG. 4B together, in the embodiment, a sense amplifier (e.g. the sense amplifier 120 of FIG. 1) of the flash memory uses the original read/write units to perform the read and write operations for the additional memory cells 220 and 230. First, in step S410, according to an address Addr (e.g. Addr=0, i.e. an initial address), the controller performs a pre-program verification for the memory cells 210 of the bytes or words corresponding to the address Addr. Next, in step S420, the controller determines whether the pre-program verification is successful, for example, it is determined whether each memory cell 210 corresponding to the address Addr is at a logic level "0". If the pre-program verification is unsuccessful (e.g. at least one memory cell 210 corresponding to the address Addr is at a logic level "1"), the controller performs a pre-program write operation, so as to program all memory cells 210 corresponding to the address Addr to a logic level "0" (step S440). Next, the procedure goes back to step S410, thus the controller repeats the pre-program verification for the memory cells 210 corresponding to the address Addr until the controller determines that the pre-program verification is successful (step S420). Next, the controller determines whether the address Addr is a last valid column address Cm (step S460). If the address Addr is not the last valid column address Cm, the procedure proceeds to step S450. Next, in step 450, the controller determines whether the address Addr exceeds a last sector address Addr_last_Sector. If the address Addr exceeds the last sector address Addr_last_Sector, the pre-program procedure is completed. Conversely, if the address Addr is smaller than or equal to the sector address Addr_last_Sector, the controller increases the address Addr by one (e.g. Addr=Addr+1, i.e. to point to the next address), so as to update the address Addr. Thus, the controller performs the pre-program verification for the memory cells 210 corresponding to the updated address Addr (step S410), and then the subsequent processes are performed. In step S460, if the address Addr is the last valid column address Cm, the controller performs the pre-program verification for the memory cell 220 of the additional column CF1 of the same row address corresponding to the address Addr and the memory cell 230 of the additional column CF2 of the same row address corresponding to the address Addr (step S480). Next, in step S482, the controller determines whether the pre-program verification is successful, for example, it is determined whether the memory cells 220 and 230 are at a logic level "0". If the pre-program verification is unsuccessful (e.g. the memory cell 220 or 230 is at a logic level "1"), the controller performs a pre-program write operation, so as to program the memory cell 220 of the additional column CF1 and the memory cell 230 of the additional column CF2 of the same row address corresponding to the address Addr to a logic level "0" (step S484), and the procedure goes back to step S480. Thus, the controller performs the pre-program verification for the memory cells 220 and 230 again (step S480). Next, the procedure goes back to step S482 until the controller determines that the pre-program verification is successful. Thus, the procedure reaches step S450, and then the subsequent processes are performed.

Figure 5A:
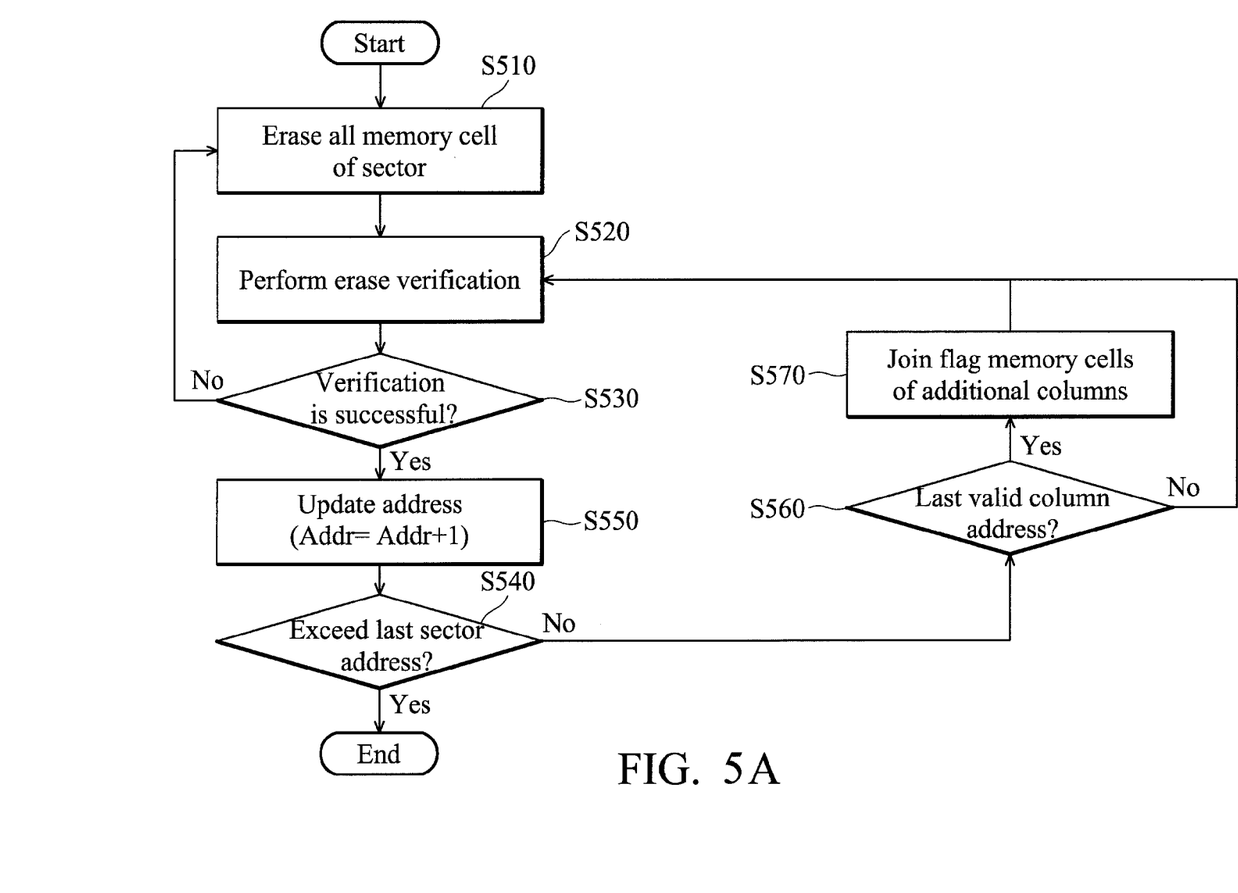
FIG. 5A shows a flow chart of an erase procedure of a flash memory according to an embodiment of the invention.

FIG. 5A shows a flow chart of an erase procedure of a flash memory according to an embodiment of the invention. Referring to FIG. 2 and FIG. 5A together, in the embodiment, a sense amplifier (e.g. the sense amplifier 120 of FIG. 1) of the flash memory uses the additional read/write units to perform the read and write operations for the additional memory cells 220 and 230. First, in step S510, the controller erases the memory cells 210, 220 and 230 of a sector. Next, in step S520, according to an address Addr (e.g. Addr=0, i.e. an initial address), the controller performs an erase verification for the memory cells 210 of the bytes or words corresponding to the address Addr. Next, in step S530, the controller determines whether the erase verification is successful, such as it is determined whether each memory cell 210 corresponding to the address Addr is at a logic level "1". If the erase verification is unsuccessful (e.g. at least one memory cell 210 corresponding to the address Addr is at a logic level "0"), the procedure goes back to step S510, to erase the memory cells 210, 220 and 230 again. Conversely, if the erase verification is successful, the controller increases the address Addr by one (e.g. Addr=Addr+1, i.e. to point to the next address), so as to update the address Addr (step S550). For example, if Addr=(Rn−1,Cm−1), the controller increases the address Addr=(Rn−1,Cm−1) by one, so as to obtain new address Addr=(Rn−1,Cm). Next, the controller determines whether the address Addr is larger than (i.e. exceeds) a last sector address Addr_last_Sector (step S540). In the embodiment, the last sector address Addr_last_Sector is a last address (e.g. (Rn, Cm)) of the sector formed by the memory cells 210. If the address Addr exceeds the last sector address Addr_last_Sector, the erase procedure is completed. Conversely, if the address Addr is smaller than or equal to the last sector address Addr_last_Sector, the controller determines whether the updated address Addr is a last valid column address Cm (step S560). If the updated address Addr is not the last valid column address Cm, the procedure goes back to step S520. Thus, the controller performs the erase verification for the memory cells 210 corresponding to the updated address Addr, and then the subsequent processes are performed. If the updated address Addr is the last valid column address Cm (i.e. Addr=Cm), the controller joins the additional bit lines CF1 and CF2 into the erase verification (step S570), so as to verify the memory cells of the address Addr and the memory cells of the additional columns CF1 and CF2 corresponding to the same row address. Thus, the controller performs the erase verification for the memory cells 210 corresponding to the last valid column address Cm, the memory cell 220 of the additional column CF1 corresponding to the same row address, and the memory cell 230 of the additional column CF2 corresponding to the same row address (step S520), and determines the result of the erase verification (step 54S530). As described above, if the erase verification is unsuccessful, for example, any one of the memory cells 210 corresponding to the last valid column address Cm, the memory cell 220 of the additional column CF1 corresponding to the same row address, or the memory cell 230 of the additional column CF2 corresponding to the same row address is at a logic level "0", the procedure goes back to step S510, to erase the memory cells 210, 220 and 230 of the sector again.

Figure 5B:
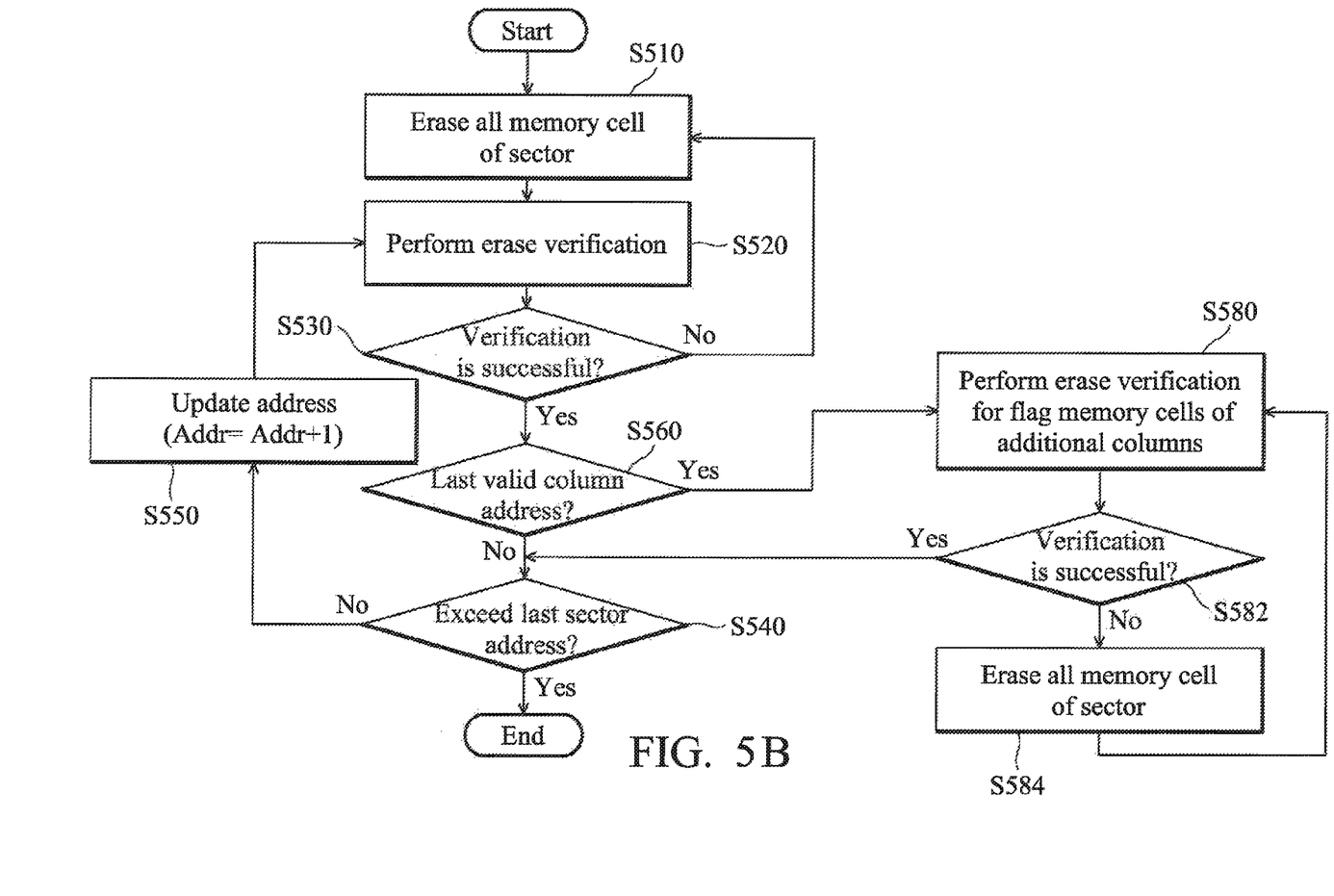
FIG. 5B shows a flow chart of an erase procedure of a flash memory according to another embodiment of the invention.

FIG. 5B shows a flow chart of an erase procedure of a flash memory according to another embodiment of the invention. Referring to FIG. 2 and FIG. 5B together, in the embodiment, a sense amplifier (e.g. the sense amplifier 120 of FIG. 1) of the flash memory uses the original read/write units to perform the read and write operations for the additional memory cells 220 and 230. First, in step S510, the controller erases the memory cells 210, 220 and 230 of a sector. Next, in step S520, according to an address Addr (e.g. Addr−0, i.e. an initial address), the controller performs an erase verification for the memory cells 210 of the bytes or words corresponding to the address Addr. Next, in step S530, the controller determines whether the erase verification is successful, e.g. it is determined whether each memory cell 210 corresponding to the address Addr is at a logic level "1". If the erase verification is unsuccessful (e.g. at least one memory cell 210 corresponding to the address Addr is at a logic level "0"), the procedure goes back to step S510, to erase the memory cells 210, 220 and 230 again. Conversely, if the erase verification is successful, the controller determines whether the address Addr is a last valid column address Cm (step S560). If the address Addr is not the last valid column address Cm, the controller determines whether the address Addr is larger than the last sector address Addr_last_Sector (step S540). If the address Addr exceeds the last sector address Addr_last_Sector, the erase procedure is completed. Conversely, if the address Addr is smaller than or equal to the last sector address Addr_last_Sector, the controller increases the address Addr by one (e.g. Addr=Addr+1, i.e. to point to the next address), so as to update the address Addr, and then the procedure goes back to step S520. Thus, the controller performs the erase verification for the memory cells 210 corresponding to the updated address Addr again, and then the subsequent processes are performed. In step S560, if the address Addr is the last valid column address Cm (i.e. Addr=Cm), the controller performs the erase verification for the memory cell 220 of the additional column CF1 and the memory cell 230 of the additional column CF2 both corresponding to the same row address (step S580). Next, in step S582, the controller determines whether the erase verification is successful, e.g. it is determined whether the memory cells 220 and 230 are at a logic level "1". If the erase verification is unsuccessful (e.g. the memory cell 220 or 230 is at a logic level "0"), the controller erases the memory cells 210, 220 and 230 of the sector again (step S584). Next, the controller performs the erase verification again for the memory cells 220 and 230 (step S580). Next, the erase verification is performed repeatedly (step S582) and the erase process is performed repeatedly (step S584) until the controller determines that erase verification is successful. Thus, the procedure goes to step S540, and then the subsequent processes are performed.

Figure 6A:
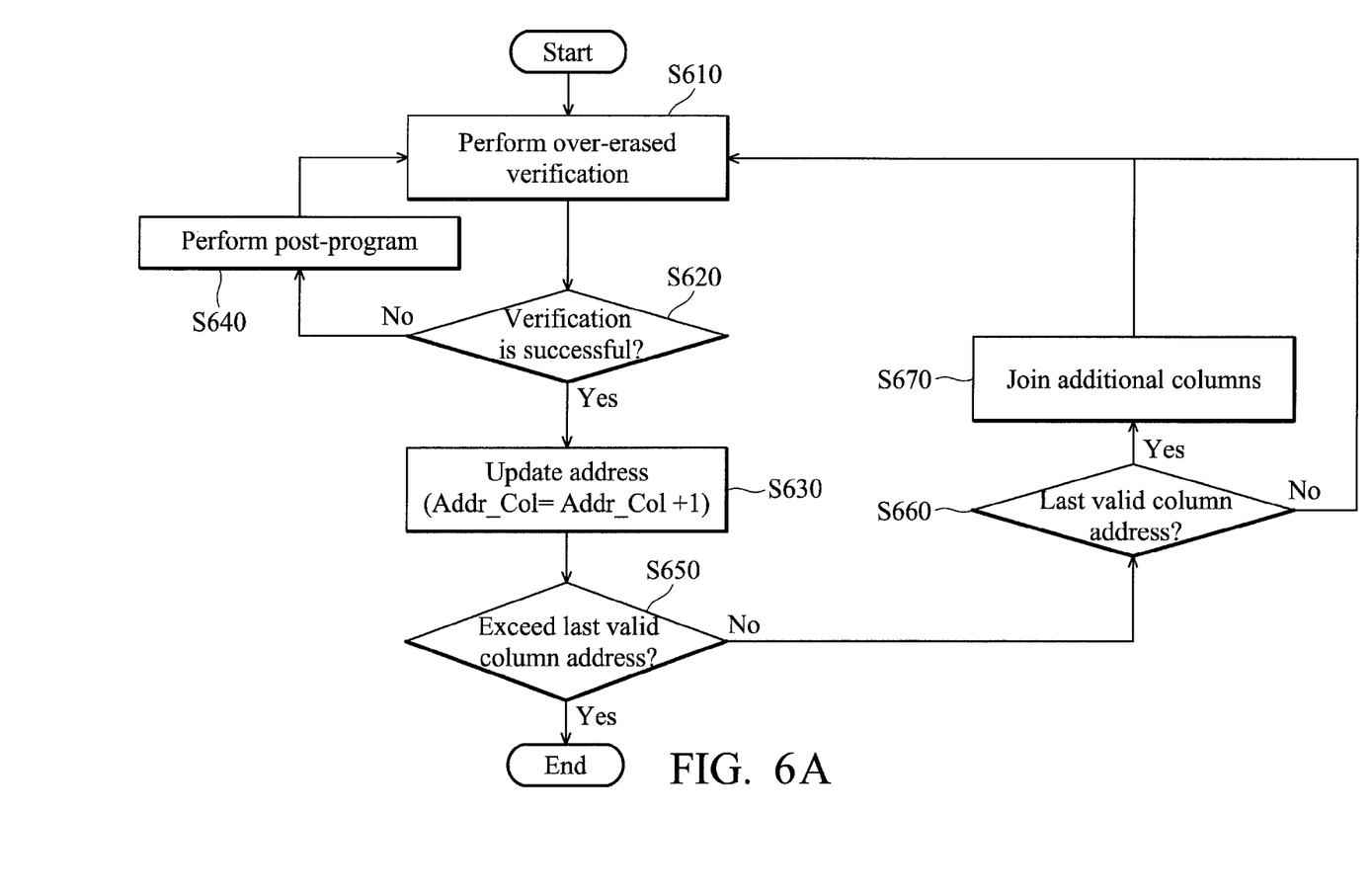
FIG. 6A shows a flow chart of a post-program procedure of a flash memory according to an embodiment of the invention.

FIG. 6A shows a flow chart of a post-program procedure of a flash memory according to an embodiment of the invention. The post-program procedure is performed to repair the over-erased memory cells. In general, the threshold voltages of the memory cells of the flash memory may be decreased after the erase procedure is completed. When the threshold voltage is too low (e.g. smaller than zero), an over-erase phenomenon happens in the memory cells, which will cause a leakage, such that the controller cannot correctly identify the data stored in the memory cells and the other memory cells disposed in the same row. Referring to FIG. 2 and FIG. 6A together, in the embodiment, a sense amplifier (e.g. the sense amplifier 120 of FIG. 1) of the flash memory uses the additional read/write units to perform the read and write operations for the additional memory cells 220 and 230. First, in step S610, according to a column address Addr_Col (e.g. Addr_Col=0, i.e. an initial address), the controller performs an over-erased verification in a unit of column line for the memory cells 210 corresponding to the column address Addr_Col. Next, in step S620, the controller determines whether the over-erased verification is successful, e.g. it is determined whether a leakage exists in the column lines when no memory cells 210 corresponding to the column address Addr_Col is selected. If the over-erased verification is unsuccessful (e.g. the leakage exists in at least one memory cell 210 corresponding to the column address Addr_Col), the controller performs a post-program write operation (or soft-program) in a unit of column line for all memory cells 210 corresponding to the column address Addr_Col (step S640), so as to adjust the threshold voltages of the memory cells 210. Next, coming back to step S610, the controller performs the over-erased verification again for the memory cells 210 corresponding to the column address Addr_Col (step S620) until the over-erased verification is successful. When the over-erased verification is successful, the controller adds the column address Addr_Col by one (e.g. Addr_Col=Addr_Col+1, i.e. to point to the next column address), so as to update the column address Addr_Col (step S630). For example, if Addr_Col=Cm−1; , the controller increases the column address Addr_Col=Cm−1 by one, so as to obtain new column address Addr_Col=Cm. Next, the controller determines whether the column address Addr_Col exceeds a last valid column address Cm (step S650). In the embodiment, the last valid column address Cm is a last column address in the array formed by the memory cells 210. If the column address Addr_Col exceeds the last valid column address Cm, the post-program procedure is complete. Conversely, if the column address Addr_Col is smaller than or equal to the last valid column address Cm, the controller determines whether the updated column address Addr_Col is a last valid column address Cm (step S660). If the updated column address Addr_Col is not the last valid column address Cm, the procedure goes back to step S610. Thus, the controller performs the over-erased verification again for the memory cells 210 corresponding to the updated column address Addr_Col, and then the subsequent processes are performed. If the updated column address Addr_Col is the last valid column address Cm (i.e. Addr_Col=Cm), the controller joins the additional bit lines CF1 and CF2 into the over-erased verification (step S670), so as to verify the memory cells of the last valid column address Addr_Col and the memory cells of the additional columns CF1 and CF2. Thus, in step S610, the controller performs the over-erased verification for the memory cells 210 corresponding to the last valid column address Cm, the memory cells 220 of the additional column CF1, and the memory cells 230 of the additional column CF2. As described above, if the over-erased verification is unsuccessful, the threshold voltages of the memory cells 210 corresponding to the column address Addr_Col, the memory cells 220 corresponding to the additional column CF1 and the memory cells 230 corresponding to the additional column CF2 are adjusted, and then the subsequent processes are performed.

Figure 6B:
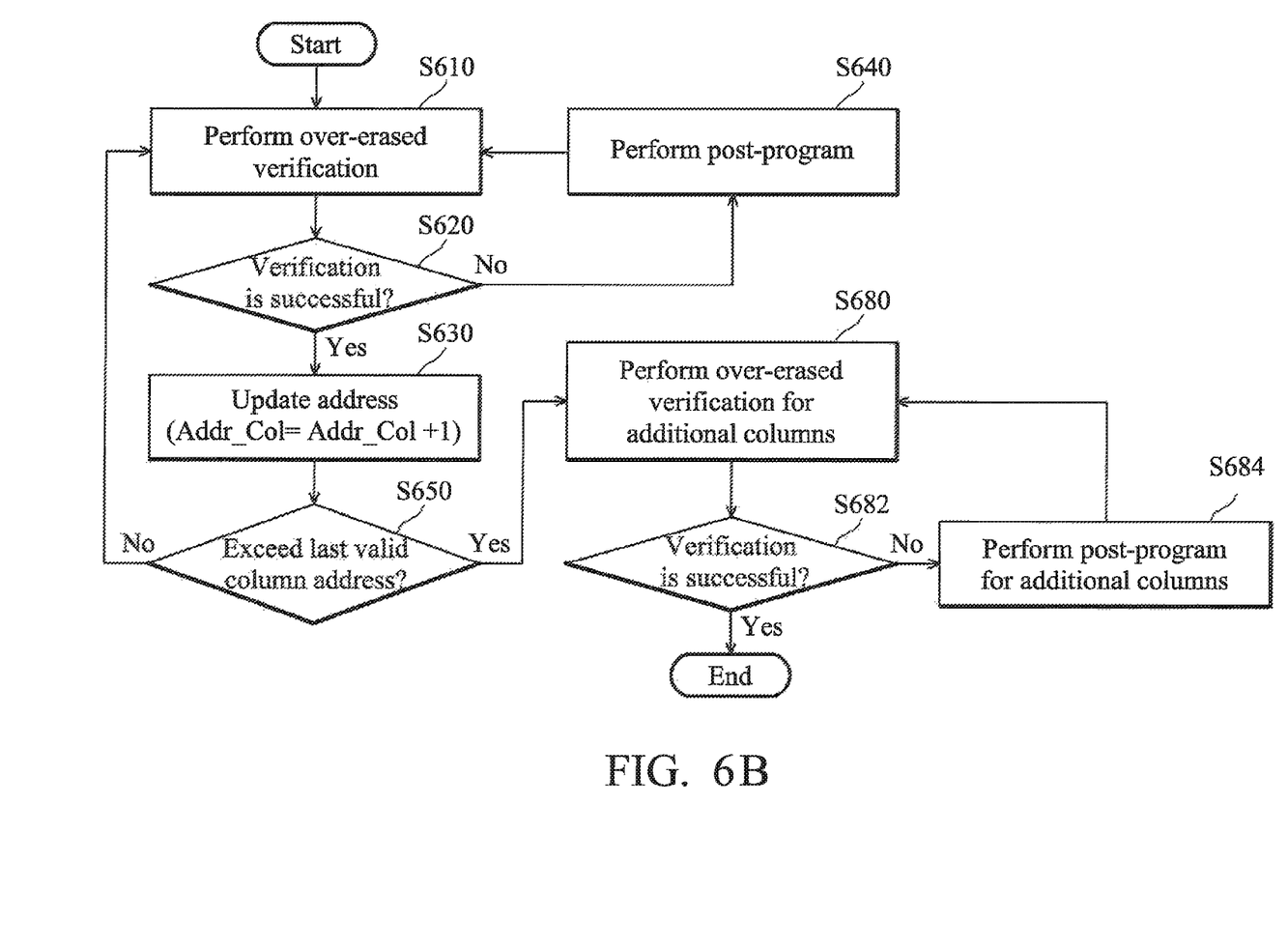
FIG. 6B shows a flow chart of a post-program procedure of a flash memory according to another embodiment of the invention.

FIG. 6B shows a flow chart of a post-program procedure of a flash memory according to another embodiment of the invention. Referring to FIG. 2 and FIG. 6B together, in the embodiment, a sense amplifier (e.g. the sense amplifier 120 of FIG. 1) of the flash memory uses the original read/write units to perform the read and write operations for the additional memory cells 220 and 230. First, in step S610, according to a column address Addr_Col (e.g. Addr_Col=0, i.e. an initial address), the controller performs an over-erased verification in a unit of column line for the memory cells 210 corresponding to the column address Addr_Col. Next, in step S620, the controller determines whether the over-erased verification is successful, e.g. it is determined whether leakage exists in the memory cells 210 corresponding to the column address Addr_Col. If the over-erased verification is unsuccessful (e.g. the leakage exists in at least one memory cell 210 corresponding to the column address Addr_Col), the controller performs a post-program write operation (or soft-program) in a unit of column line for all memory cells 210 corresponding to the column address Addr_Col (step S640), so as to adjust the threshold voltages of the memory cells 210. Next, coming back to step S610, the controller performs the over-erased verification again for the memory cells 210 corresponding to the column address Addr_Col (step S620) until the over-erased verification is successful. When the over-erased verification is successful, the controller adds the column address Addr_Col by one (e.g. Addr_Col=Addr_Col+1, i.e. to point to the next column address), so as to update the column address Addr_Col (step S630). Next, in step 650, the controller determines whether the column address Addr_Col exceeds a last valid column address Cm. If the column address Addr_Col is smaller than or equal to the last valid column address Cm, the procedure goes back to step S610. Thus, the controller performs the over-erased verification for the memory cells 210 corresponding to the updated column address Addr_Col (step S610), and then the subsequent processes are performed. In step S650, if the column address Addr_Col exceeds the last valid column address Cm (i.e. Addr_Col=Cm), the controller performs the over-erased verification for the memory cells 220 corresponding to the additional column CF1 and the memory cells 230 corresponding to the additional column CF2 (step S680). Next, in step S682, the controller determines whether the over-erased verification is successful, i.e. it is determined whether leakage exists in the memory cells 220 and 230. If the over-erased verification is unsuccessful (e.g. a leakage exists in the memory cell 220 or 230), the controller performs the post-program write operation in a unit of column line for all memory cells 220 corresponding to the additional column CF1 and all memory cells 230 corresponding to the additional column CF2 (S684), so as to adjust the threshold voltages of the memory cells 220 corresponding to the additional column CF1 and the memory cells 230 corresponding to the additional column CF2, and then the procedure goes back to step S680. Thus, the controller performs the over-erased verification again for the memory cells 220 and 230 (step S680), and then the subsequent processes are performed until the controller determines that the over-erased verification is successful (step S682). Thus, the post-program procedure is completed.

Figure 7:
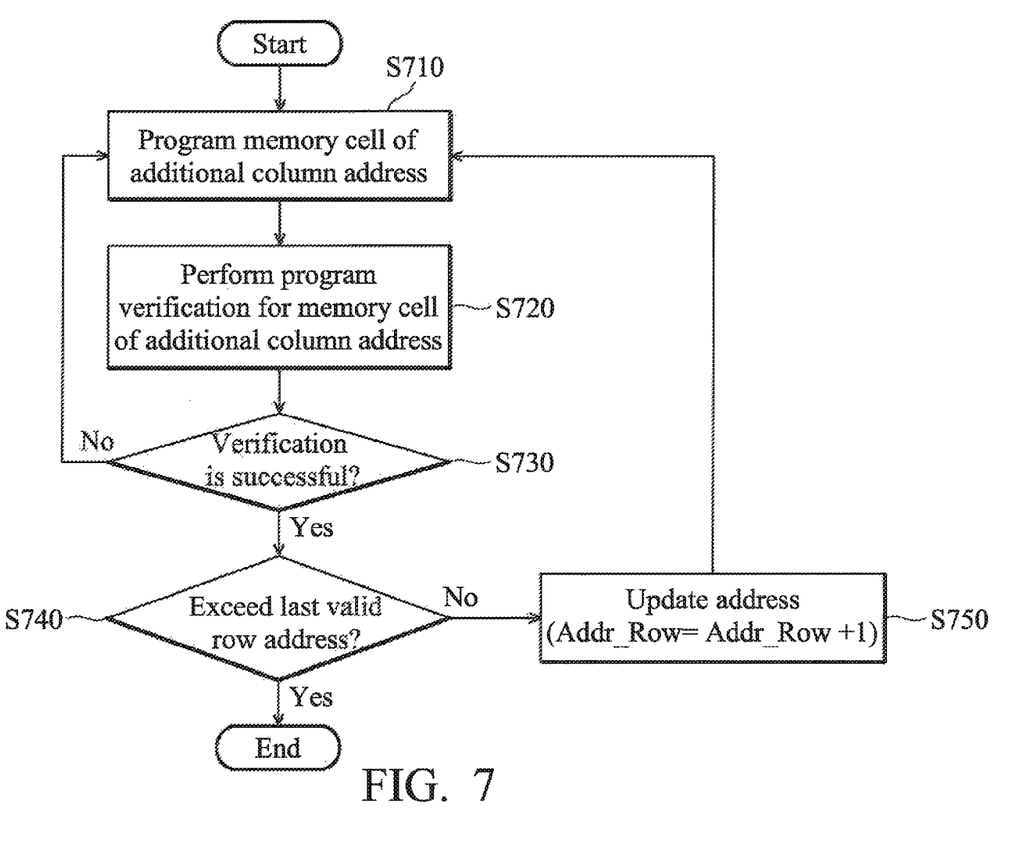
FIG. 7 shows a flow chart of a mark procedure of a flash memory according to an embodiment of the invention.

FIG. 7 shows a flow chart of a mark procedure of a flash memory according to an embodiment of the invention. Referring to FIG. 2 and FIG. 7 together, in the embodiment, the memory cells 230 are used to represent whether the erase procedure of the memory cells of the corresponding column lines are completed. It should be noted that using the memory cells 230 to record the result of the erase procedure is an example and not meant to limit the invention. In one embodiment, the memory cells 220 are used to record the result of the erase procedure. In another embodiment, more memory cells 230 or 220 can be used to record the result of the erase procedure. First, in step S710, according to a row address Addr_Row (e.g. Addr_Row=R0, i.e. an initial row address), the controller programs the memory cells 230 corresponding to the row address Addr_Row to a logic level "0". Next, in step S720, the controller performs a program verification for the memory cells 230. Next, in step S730, the controller determines whether the program verification is successful, e.g. it is determined whether the memory cell 230 is at a logic level "0". If the program verification is unsuccessful (e.g. the memory cell 230 is at a logic level "1"), the procedure goes back to step S710, to program the memory cell 230 again. Conversely, if the program verification is successful, the controller determines whether the row address Addr_Row exceeds a last valid row address Rn (step S740). If the row address Addr_Row exceeds the last valid row address Rn, the mark procedure is completed. Conversely, if the row address Addr_Row is smaller than or equal to the last valid row address Rn, the controller adds the row address Addr_Row by one (e.g. Addr_Row=Addr_Row+1, i.e. to point to the next row address), and the procedure goes back to step S710. Next, the controller programs the memory cells 230 corresponding to the updated row address Addr_Row to a logic level "0", and then the subsequent processes are performed.

Figure 8A:
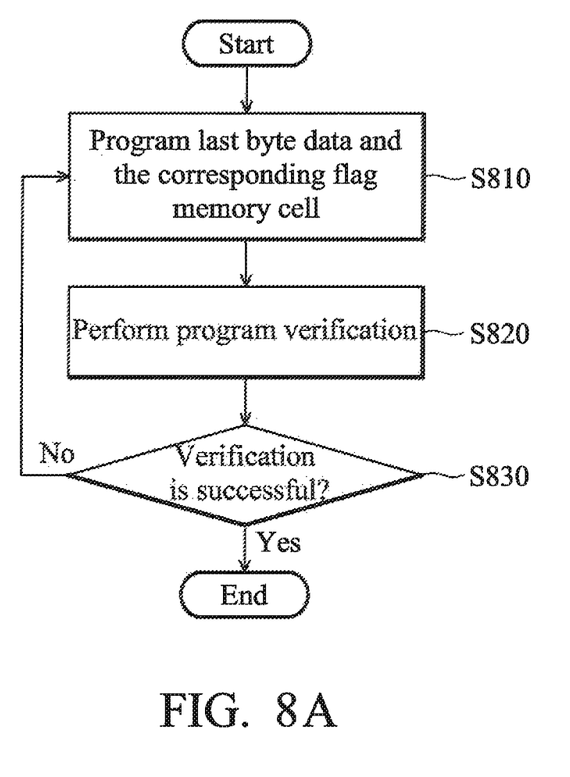
FIG. 8A shows a flow chart of a mark procedure of a flash memory according to another embodiment of the invention.

FIG. 8A shows a flow chart of a mark procedure of a flash memory according to another embodiment of the invention. Referring to FIG. 2 and FIG. 8A, in the embodiment, the memory cells 220 are used to represent whether the memory cells of the corresponding row lines have performed a program procedure. Moreover, a sense amplifier (e.g. the sense amplifier 120 of FIG. 1) of the flash memory uses the additional read/write units to perform the read and write operations for the additional memory cells 220. It should be noted that using the memory cells 220 to record the result of the program procedure is an example and not meant to limit the invention. In one embodiment, the memory cells 230 may be used to record the result of the program procedure, and the memory cells 220 may be used to record the result of a mark procedure of a sector. In another embodiment, more memory cells 230 or 220 can be used to record the result of the program procedure and the erase procedure. In the embodiment, the controller programs the memory cells 210 of the selected sector in a unit of byte or word according to a program instruction. First, in step S810, when the data to be programmed is a last byte data, the controller programs the last byte data to the corresponding memory cells 210 according to the address Addr, and programs the memory cells 220 disposed in the same row to a logic level "0". Next, in step S820, the controller performs a program verification for the programmed memory cells 210 and 220 corresponding to the address Addr. Next, in step S830, the controller determines whether the program verification is successful, e.g. it is determined whether the memory cells 210 conform to the program data and the memory cell 220 is at a logic level "0". If the program verification is unsuccessful (e.g. the memory cell 220 is a logic level "1" or the logic levels of the memory cells 210 are incorrect), the procedure goes back to step S810, to program the memory cells 210 and 220 again. Conversely, if the program verification is successful, the mark procedure is completed.

Figure 8B:
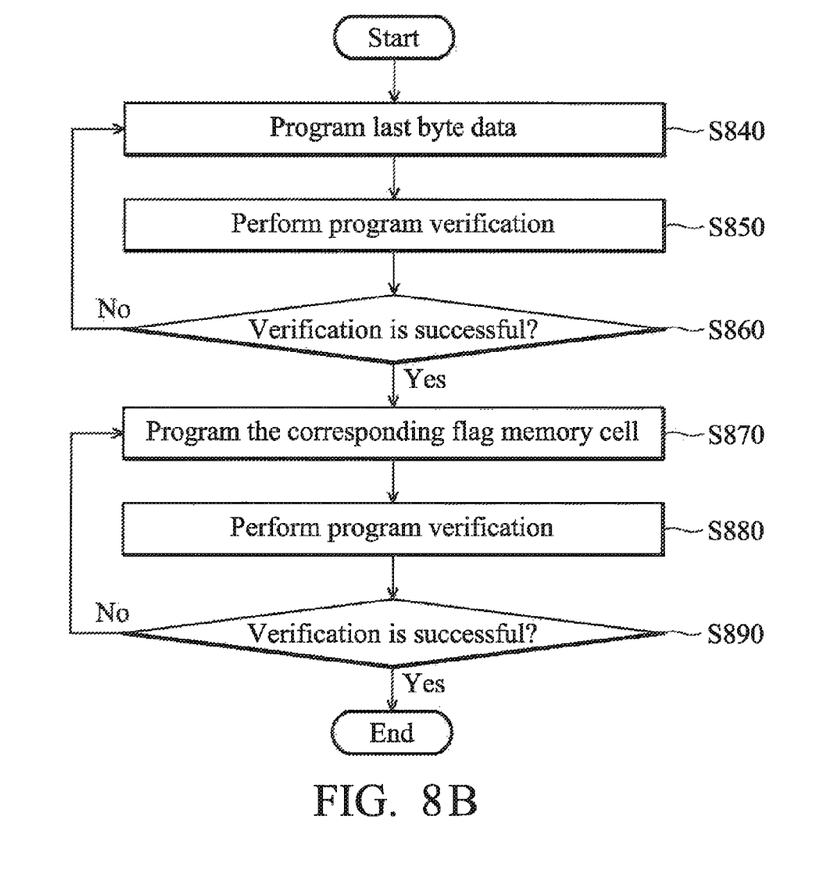
FIG. 8B shows a flow chart of a mark procedure of a flash memory according to another embodiment of the invention.

FIG. 8B shows a flow chart of a mark procedure of a flash memory according to another embodiment of the invention. Referring to FIG. 2 and FIG. 8B, in the embodiment, the memory cells 220 are used to represent whether the memory cells of the corresponding row lines have performed a program procedure. Moreover, a sense amplifier (e.g. the sense amplifier 120 of FIG. 1) of the flash memory uses the original read/write units to perform the read and write operations for the additional memory cells 220. It should be noted that using the memory cells 220 to record the result of the program procedure is an example and not meant to limit the invention. In one embodiment, the memory cells 230 may be used to record the result of the program procedure, and the memory cells 220 may be used to record the result of a mark procedure of a sector. In another embodiment, more memory cells 230 or 220 can be used to record the result of the program procedure. In the embodiment, the controller programs the memory cells 210 of the selected sector in a unit of byte or word according to a program instruction. First, in step S840, when the data to be programmed is a last byte data, the controller programs the last byte data to the corresponding memory cells 210 according to the address Addr. Next, in step S850, the controller performs a program verification for the programmed memory cells 210. Next, in step S860, the controller determines whether the program verification is successful. If the program verification is unsuccessful (e.g. the logic levels of the memory cells 210 are incorrect), the procedure goes back to step S840, to program the memory cells 210 again. Conversely, if the program verification of the memory cells 210 is successful, the controller programs the memory cell 220 disposed in the same row to a logic level "0" (step S870). Next, in step S880, the controller performs the program verification for the programmed memory cell 220. Next, in step S890, the controller determines whether the program verification is successful, e.g. it is determined whether the memory cell 220 is at a logic level "0". If the program verification of the memory cells 220 is unsuccessful (e.g. the memory cell 220 is at a logic level "1"), the procedure goes back to step S870, to program the memory cells 220 again. Conversely, if the program verification is successful, the mark procedure is completed.

In general, before programming data to a memory array, the controller must confirm that the selected sector is blank first, and then the controller can program the data to the blank sector. In general, when an interrupt happens in an erase procedure of a conventional flash memory, the erase procedure cannot be performed completely. Therefore, in the conventional flash memory, the controller sometimes performs an erase verification for all memory cells of the selected sector in advance, and performs an over-erased verification, so as to confirm that no over-erased memory cell exists in the selected sector. However, it requires more time to complete the erase verification and the over-erased verification for all memory cells of the selected sector. Moreover, for a flash memory implemented in a portable electronic device, the read/write units are added to speed up the erase verification and over-erased verification, thus power consumption is increased. In the embodiments of the invention, by reading the states of the memory cells (e.g. the memory cells 220 and 230 of FIG. 2) disposed in the additional column lines (e.g. the column lines CF1 and CF2 of FIG. 2), the controller can determine whether the selected sector has performed the erase procedure completely, and the controller can further determine whether the selected sector is a blank sector without performing the erase verification and the over-erased verification for the selected sector. Therefore, the time required for determining whether the selected sector is a blank sector is reduced, thereby decreasing power consumption. For example, in one embodiment, the memory cells 220 and the memory cells 230 are used to represent whether the memory cells of the corresponding column lines have completed the erase procedure. If all memory cells 230 of the selected sector are at a logic level "0" and all memory cells 220 of the selected sector is at logic level "1", the controller can determine that the sector has be erased completely, as shown in table 1 below. Thus, the controller can program the data to the sector. After the data has be programmed, the controller can program the memory cells 220 of the sector according the mark procedure, as described above. In the embodiment, the memory cells 220 are used to represent whether the memory cells of the corresponding column lines have been programmed. For example, when page data is programmed, the controller may program the memory cells 220 of the same row lines to a logic level "0" after a last byte is programmed. Therefore, if the memory cells 220 of the selected sector are at a logic level "0" and all memory cells 230 are at a logic level "0", the controller can determine that the sector has been used and is not a blank sector. Furthermore, if some memory cells 230 of the selected sector are at a logic level "1", the controller can determine that the sector has not been erased completely. Especially, if all memory cells 220 are at a logic level "1" and all memory cells 230 are also at a logic level "1", the controller can determine that an erase interrupt has happened in the sector, and the sector may have some over-erased memory cells. Therefore, the memory cells of the sector can be erased again according to the method of FIG. 3, to avoid the over-erased memory cells that will cause data integrity misjudgment.

TABLE 1

| Blank sector check | Memory cell 220 | Memory cell 230 | Sector state |
|---|---|---|---|
| Successful | "1" | "0" | Blank sector |
| Unsuccessful | "1"->"0" "0" | "0" | Sector has been used (some part has been programmed) |
| Unsuccessful | "0" X ("1"->"0") "1" | "0" "1" | Erase Interrupt |

As described above, by using the memory cells of the additional column lines to record the usage state of the memory of the corresponding row lines in the memory array, the controller can quickly determine whether the selected sector is blank. Furthermore, by marking the memory cells of the column, the number of program and erase times can be scattered validly, such that the write cycling time is equal to that of the data memory cells. Moreover, the arrangement order and a quantity of the memory cells 220 and 230 can be determined according actual application.

While the invention has been described by way of example and in terms of the preferred embodiments, It should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An erase method for a flash memory, comprising:
pre-programming a plurality of first memory cells of the flash memory, wherein the first memory cells are disposed in a memory array formed by a plurality of row lines and a plurality of column lines;
erasing the pre-programmed first memory cells;
post-programming the erased first memory cells, to repair the over-erased first memory cells; and
programming a plurality of second memory cells after the erased first memory cells are post-programmed, wherein the second memory cells are disposed in a first specific column line of the memory array, and the first specific column line is arranged after a last column line of the column lines;
wherein the memory array further comprises a plurality of third memory cells disposed in a second specific column line of the memory array, wherein the second specific column line is arranged after the last column line of the column lines and is adjacent to the first specific column line,
wherein the last column line of the column lines not having the second and third memory cells corresponds to a last valid column address.

2. The erase method as claimed in claim 1, wherein the step of pre-programming the first memory cells of the flash memory further comprises:
performing a pre-program verification according to a first address for the first memory cells corresponding to the first address, to determine whether the first memory cells corresponding to the first address is at a low logic level;
programming the first memory cells corresponding to the first address when at least one of the first memory cells corresponding to the first address is at a high logic level; and
completing a pre-program procedure when the first memory cells are programmed and the first address exceeds a last sector address.

3. The erase method as claimed in claim 2, wherein the step of pre-programming the first memory cells further comprises:
updating the first address to a second address when the first memory cells are programmed and the first address does not exceed the last sector address;
performing the pre-program verification according to the second address for the first, second and third memory cells corresponding to the second address when the second address is the last valid column address, to determine whether the first, second and third memory cells corresponding to the second address is at a low logic level;
programming the first, second and third memory cells corresponding to the second address when at least one of the first, second and third memory cells corresponding to the second address is at a high logic level; and
completing the pre-program procedure when the first, second and third memory cells corresponding to the second address are programmed and the second address exceeds the last sector address.

4. The erase method as claimed in claim 1, wherein the step of erasing the pre-programmed first memory cells further comprises:
erasing the first, second and third memory cells of a sector;
performing an erase verification according to a first address for the erased first memory cells corresponding to the first address, to determine whether the erased first memory cells corresponding to the first address is at a high logic level;
re-erasing the first, second and third memory cells when at least one of the erased first memory cells corresponding to the first address is at a low logic level; and
completing an erase procedure when the erased first memory cells corresponding to the first address are at a high logic level and the first address exceeds a last sector address.

5. The erase method as claimed in claim 4, wherein the step of erasing the pre-programmed first memory cells further comprises:
updating the first address to a second address when the erased first memory cells corresponding to the first address are at a high logic level and the first address does not exceed the last sector address;
performing the erase verification according to the second address for the erased first, second and third memory cells corresponding to the second address when the second address is the last valid column address, to determine whether the erased first, second and third memory cells corresponding to the second address is at a high logic level;

re-erasing the first, second and third memory cells when one of the erased first, second and third memory cells corresponding to the second address is at a low logic level; and completing the erase procedure when the erased first, second and third memory cells corresponding to the second address are at a high logic level and the second address exceeds the last sector address.

6. The erase method as claimed in claim 1, wherein the step of post-programming the erased first memory cells further comprises:

performing an over-erased verification according to a first address for the first memory cells corresponding to the first address, to determine whether the erased first memory cells corresponding to the first address are over-erased;

post-programming the over-erased first memory cells when one of the erased first memory cells is over-erased; and updating the first address to a second address when no erased first memory cell is over-erased.

7. The erase method as claimed in claim 6, wherein the step of post-programming the erased first memory cells further comprises:

performing the over-erased verification according to the second address for the first, second and third memory cells corresponding to the second address when the second address exceeds the last valid column address, to determine whether the erased first, second and third memory cells corresponding to the second address are over-erased; and completing a post-program procedure when the second and third memory cells are not over-erased.

8. The erase method as claimed in claim 1, wherein the step of programming the second memory cells further comprises:

programming the second memory cell according to a first address, wherein the programmed second memory cell corresponds to the first address;

performing a program verification for the programmed second memory cell corresponding to the first address, to determine whether the second memory cell corresponding to the first address is at a low logic level; and re-programming the second memory cell corresponding to the first address when the programmed second memory cell corresponding to the first address is at a high logic level.

9. The erase method as claimed in claim 8, wherein the step of programming the second memory cells further comprises:

finishing erasing the flash memory when the programmed second memory cell corresponding to the first address is at the low logic level and the first address exceeds a last valid row address;

updating the first address to a second address when the programmed second memory cell corresponding to the first address is at the low logic level and the first address does not exceed the last valid row address;

programming the second memory cell according to the second address, wherein the programmed second memory corresponds to the second address;

performing the program verification for the programmed second memory cell corresponding to the second address, to determine whether the second memory cell corresponding to the second address is at the low logic level;

re-programming the second memory cell corresponding to the second address when the programmed second memory cell corresponding to the second address is at the high logic level; and finishing erasing the flash memory when the programmed second memory cell corresponding to the second address is at the low logic level and the second address exceeds the last valid row address.

10. The erase method as claimed in claim 1, further comprising:

programming the first memory cells corresponding to a written address according to data to be programmed after the flash memory is erased; and programming the third memory cell corresponding to the written address, to indicate that the first memory cells of the row line corresponding to the written address have been programmed.

11. The erase method as claimed in claim 1, further comprising:

determining whether a sector is a blank sector according to the logic levels of the second and third memory cells of the sector in the flash memory, wherein the sector is the blank sector when the second memory cells are at a low logic level and the third memory cells are at a high logic level.

12. The erase method as claimed in claim 11, wherein the sector is not the blank sector when the second memory cells are at the low logic level and at least one of the third memory cells is at the low logic level, and the sector is not the blank sector when at least one of the second memory cells is at the high logic level.

* * * * *